United States Patent [19]
Fukuda

[11] Patent Number: 6,072,350
[45] Date of Patent: Jun. 6, 2000

[54] ELECTROSTATIC BREAKDOWN PROTECTION FOR A SEMICONDUCTOR DEVICE

[75] Inventor: Takeshi Fukuda, Kanagawa, Japan

[73] Assignee: NEC Corporation, Tokyo, Japan

[21] Appl. No.: 09/335,725

[22] Filed: Jun. 18, 1999

Related U.S. Application Data

[63] Continuation of application No. 08/780,842, Jan. 9, 1997, abandoned.

[30] Foreign Application Priority Data

Jan. 17, 1996 [JP] Japan ................................. 8-5893

[51] Int. Cl.[7] .................................................. H03K 5/08
[52] U.S. Cl. ........................... 327/313; 327/314; 327/327; 391/56
[58] Field of Search ............................... 327/309, 313, 327/314, 327; 361/56, 91, 111; 257/362, 546

[56] References Cited

U.S. PATENT DOCUMENTS

| | | | |
|---|---|---|---|
| 5,290,724 | 3/1994 | Leach | 437/51 |
| 5,379,175 | 1/1995 | Masaki | 361/56 |
| 5,629,545 | 5/1997 | Leach | 257/362 |
| 5,644,460 | 7/1997 | Clukey | 361/56 |
| 5,670,799 | 9/1997 | Croft | 257/173 |
| 5,717,559 | 2/1998 | Narita | 361/56 |
| 5,721,656 | 2/1998 | Wu et al. | 361/56 |
| 5,731,940 | 3/1998 | Minogue | 361/56 |
| 5,751,051 | 5/1998 | Hayano | 257/546 |
| 5,875,086 | 2/1999 | Narita | 361/56 |

FOREIGN PATENT DOCUMENTS 7-86510 3/1995 Japan.

*Primary Examiner*—Terry D. Cunningham
*Attorney, Agent, or Firm*—Young & Thompson

[57] ABSTRACT

A SUB wiring provided outside of a common discharge line formed on outer periphery of a chip in parallel to the latter. To the common discharge line, only voltage clamping elements and diode elements as electrostatic protection elements are connected. The common discharge line is in floating condition for rising withstanding voltage. On the other hand, to the SUB wiring, additional circuits, such as BBG circuit and so forth, consisting of transistors are connected to connect the latter to the substrate. With these two wirings, the width of the common discharge line can be made narrower to limit an increase of a chip area. By this, it is possible to improve resistance to electrostatic breakdown without increasing chip area.

6 Claims, 5 Drawing Sheets

ELECTROSTATIC BREAKDOWN PROTECTION FOR A SEMICONDUCTOR DEVICE

This application is a continuation of application Ser. No. 08/780,842, filed Jan. 9, 1997, now abandoned.

BACKGROUND OF THE INVENTION

Field of the Invention

The present invention relates generally to a semiconductor device. More specifically, the invention relates to electrostatic breakdown or damage protection for a semiconductor integrated circuit on a semiconductor substrate.

A technique for providing electrostatic breakdown protection for a semiconductor integrated circuit has been disclosed in Japanese Unexamined Patent Publication (Kokai) No. Heisei 7-86510.

FIG. 1 is a circuit diagram showing one example of such a conventional semiconductor device. As shown in FIG. 1, the conventional semiconductor device is provided with a plurality of voltage clamping (VC) elements 2A to 2M and a plurality of diode elements 3A to 3M connected to respective terminals in parallel as protection elements. A common discharge line 18 is provided for discharging an electrostatic pulse applied to respective terminals namely, a power source (VCC) terminal 10, an input terminal 11, Gnd terminal 12, an output circuit power source (VCCQ) terminal 13, an output terminal 14, an output circuit GndQ terminal 15, an internal circuit Gnd terminal 16 and other terminal 17 and so forth, of the semiconductor integrated circuit constructed with an internal circuit 4, an inverter 5 connected to the internal circuit 4, an output transistor 6, a protection resistor 7 and a BVDS transistor 8. The common discharge line 18 has a wiring structure constructed in common with a SUB wiring connected to a back-bias generator (BBG circuit) 9 which is connected to substrate 21 (see FIG. 2) for supplying a potential to the semiconductor substrate 21 to maintain a constant substrate voltage therein, in order to avoid increasing chip area.

In case of a dynamic memory (DRAM) a negative potential is applied to the semiconductor substrate. As a potential supply method, aluminum wiring is provided at the outermost circumference (scribe line region) of the semiconductor substrate for connection with the substrate to provide a negative potential to the substrate as substrate potential by means of the BBG circuit 9. Therefore, the substrate per se assumes a floating condition to an external terminal.

As set forth above, in the conventional semiconductor device, the SUB wiring is employed as the common discharge line 18 for protection from electrostatic breakdown.

FIG. 2 is a section of a scribe line region on the semiconductor substrate including the circuit for FIG. 1. As shown in FIG. 2, the conventional semiconductor device includes in the scribe line region 25 formed at the outermost circumference of the chip, a field oxide layer 22 on a P-type substrate (P-Sub) 21, a P-type diffusion layer 23 therebetween, and an interlayer insulation layer 24 and the common discharge line 18 on the diffusion layer 23. In such device, the substrate 21 is connected to terminals 10–17 via voltage clamping elements 2A–2M and diode elements 3A–3M. As a result, the substrate 21 is isolated from these terminals except for a time when an electrostatic pulse is applied to at least one of terminals 10–17.

FIG. 3 is a plan view showing layout on the chip including the circuit shown in FIG. 1. As shown in FIG. 3, the chip 30 is formed by arranging on substrate 21 an internal circuit 4 at the center portion and the common discharge line 18 in a loop at the outermost circumference (scribe line region). In order to protect the internal circuit 4, the common discharge line 18 is connected to the input terminal 11 via a protection element, to the Gnd terminal 16 via a protection element, and to the BBG circuit 9. Furthermore, the common discharge line 18 is connected to the semiconductor substrate 21 through diffusion region 23 as shown in FIG. 2.

Each of terminals 10 to 17 of the conventional semiconductor device as set forth above, are connected to the common discharge line 18 by the voltage clamping elements 2A to 2M and the diode elements 3A to 3M in parallel connection. In conjunction therewith, the BBG circuit 9 maintaining a substrate voltage constant also connects its output transistor to the common discharge line 18.

For example, in the circuit of FIG. 1, the Gnd terminal 16 becomes a discharging terminal and the voltage clamping element 2B is turned ON, when a positive electrostatic pulse is applied to the input terminal 11. A voltage where the clamping element 2B should be turned ON is set to be higher than an absolute maximum rating of the power source voltage VCC and to be lower than a withstanding voltage of the gate oxide layer and PN junction. It should be noted that between the input terminal 11 and the gate of an inverter circuit 5, a protection resistor 7 is provided so that the peak of the electrostatic pulse may not directly influence the inverter circuit 5.

Accordingly, after turning ON the clamping element 2B, an electrostatic pulse applied to the input terminal 11 is discharged to GND terminal 16 via voltage clamping element 2G and the common discharge line 18.

The conventional semiconductor device prevents electrostatic breakdown with respect to the internal circuit 4 by providing a discharge path as set forth above.

The above-mentioned conventional semiconductor device integrates the common discharge line and the SUB wiring as an electrostatic breakdown protection device. Accordingly, if the semiconductor substrate is at ground level, the discharge pulse is discharged to the ground acting as a discharging terminal via the common discharge line without passing through the clamping element and the diode so as not to cause the problem of electrostatic breakdown.

However, in some semiconductor devices, such as a DRAM, a negative potential is frequently applied to the semiconductor substrate. In such cases, it becomes necessary to provide the BBG circuit as the circuit for applying the negative potential to the semiconductor substrate on the discharge path of the electrostatic pulse. Therefore, by connecting the output transistor of the BBG circuit to the common discharge line, the following problems are encountered.

Namely, the first problem is that when the electrostatic pulse is applied to the input terminal 11 the Gnd terminal 16 becomes a discharging terminal in FIG. 3, and the electrostatic pulse applied to the input terminal 11 is discharged to the Gnd terminal 16 via the common discharge line 18. However, the gate and drain of the output transistor of the BBG circuit 9 are also connected to the common discharge line 18. Thus, when the electrostatic pulse is repeatedly applied, it is possible to cause breakdown of a PN junction of the output transistor of the BBG circuit.

A reason for the breakdown in the junction is the flowing of a large current. For example, in an electrostatic breakdown test by the C-V charge method, when a pulse of discharge voltage ±2000V is charged, with a current at capacity of 100 pF and a resistance value of 1500Ω, a large current of 1.33A flows at the peak.

However, a resistance value of the common discharge line 18 is increased as the loop distance increases due to greater chip side length. For example, for a chip 7 mm square, when the electrostatic pulse is applied to a terminal located at the most distanced position from the BBG circuit 9, the resistance value can be several tens of ohms. In fact, when the resistance value of the common discharge line 18 is assumed to be 20Ω, 26.66V can be applied to the diffusion layer of the BBG circuit 9 and the gate oxide layer. When the withstanding voltage of the PN junction of the gate oxide layer is assumed to be several tens of volts, the voltage in excess of the withstanding voltage can be applied.

Therefore, when the common discharge line 18 and the SUB wiring are provided as a common wiring such as shown in FIG. 2, a transistor connected to the SUB circuit can breakdown. On the other hand, in consideration of the problem of breakdown, when a resistance value of the common discharge line 18 is to be limited to several ohms, the only measure to be taken is to increase the wiring width of the common discharge line 18. However, this increases chip size.

A second problem is that when the negative potential is applied to the substrate, the diffusion layer can be a source of electron injection to possibly cause breakdown in an N-type diffusion layer or the gate oxide layer of the Gnd and VCC terminals via the gate in the vicinity thereof. Such a problem has been known in recent years as GCD (Gate Controlled Diode) mode.

When an additional circuit is directly connected to the common discharge line, namely when a gate or diffusion layer of a transistor in the additional circuit is connected to the common discharge line, the additional circuit per se may breakdown.

SUMMARY OF THE INVENTION

It is an object of the present invention to provide a semiconductor device with improved ability to withstand electrostatic breakdown without increasing chip area.

A semiconductor device, according to the present invention, comprises:

a plurality of terminals connected to a semiconductor integrated circuit formed on a semiconductor substrate;

a plurality of voltage clamping elements and a plurality of diode elements as protective elements, respective one of which being connected to one of said terminals;

a common discharge line commonly connected to the other of said voltage clamping element and said diode element and formed with a metal wiring, the common discharge line being in floating condition relative to the semiconductor substrate;

additional circuits including a back bias generating circuit supplying a back bias to the semiconductor substrate; and a SUB wiring of a metal wiring connected to the additional circuit including the back bias generating circuit via a tunnel wiring, and being independent of the common discharge line.

In the semiconductor device according to the present invention, the common discharge line and the SUB wiring are wired in parallel to each other.

Also, in the semiconductor device according to the present invention, the SUB wiring is connected only to the additional circuit, such as the back bias generating circuit.

In the semiconductor device according to the present invention, the common discharge line and the SUB wiring are arranged outside of the voltage clamping element, the plurality of diode elements and a plurality of terminals and along outer circumference of the chip.

In the semiconductor device according to the present invention, the SUB wiring is formed outside of the common discharge line and in parallel thereto.

Also, a semiconductor device, according to the present invention, comprises:

a plurality of terminals connected to a semiconductor integrated circuit formed on a semiconductor substrate;

a plurality of voltage clamping elements and a plurality of diode elements as protective elements, respective one of which being connected to one of said terminals;

a common discharge line commonly connected to the other of the plurality of voltage clamping elements and the plurality of diode elements and formed with a metal wiring, the common discharge line being in floating condition relative to the semiconductor substrate;

additional circuits including a back bias generating circuit supplying a back bias to the semiconductor substrate; and a SUB wiring of a metal wiring connected to the additional circuit including the back bias generating circuit via a tunnel wiring, located outside of the common discharge line in parallel thereto and being independent of the common discharge line.

In the semiconductor device according to the present invention, the common discharge line formed with a metal wiring and the SUB wiring formed with the metal wiring, for connecting the additional circuit, such as BBG circuit for supplying potential to the semiconductor substrate are completely separated. By placing the common discharge line in floating condition, withstanding voltage against electrostatic breakdown can be improved with restricting increasing of the chip area.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

Next, the preferred embodiment of the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In some instances, well-known structures, such as transistor control connections, are not shown in detail in order to clearly depict the present invention.

Figure 1:
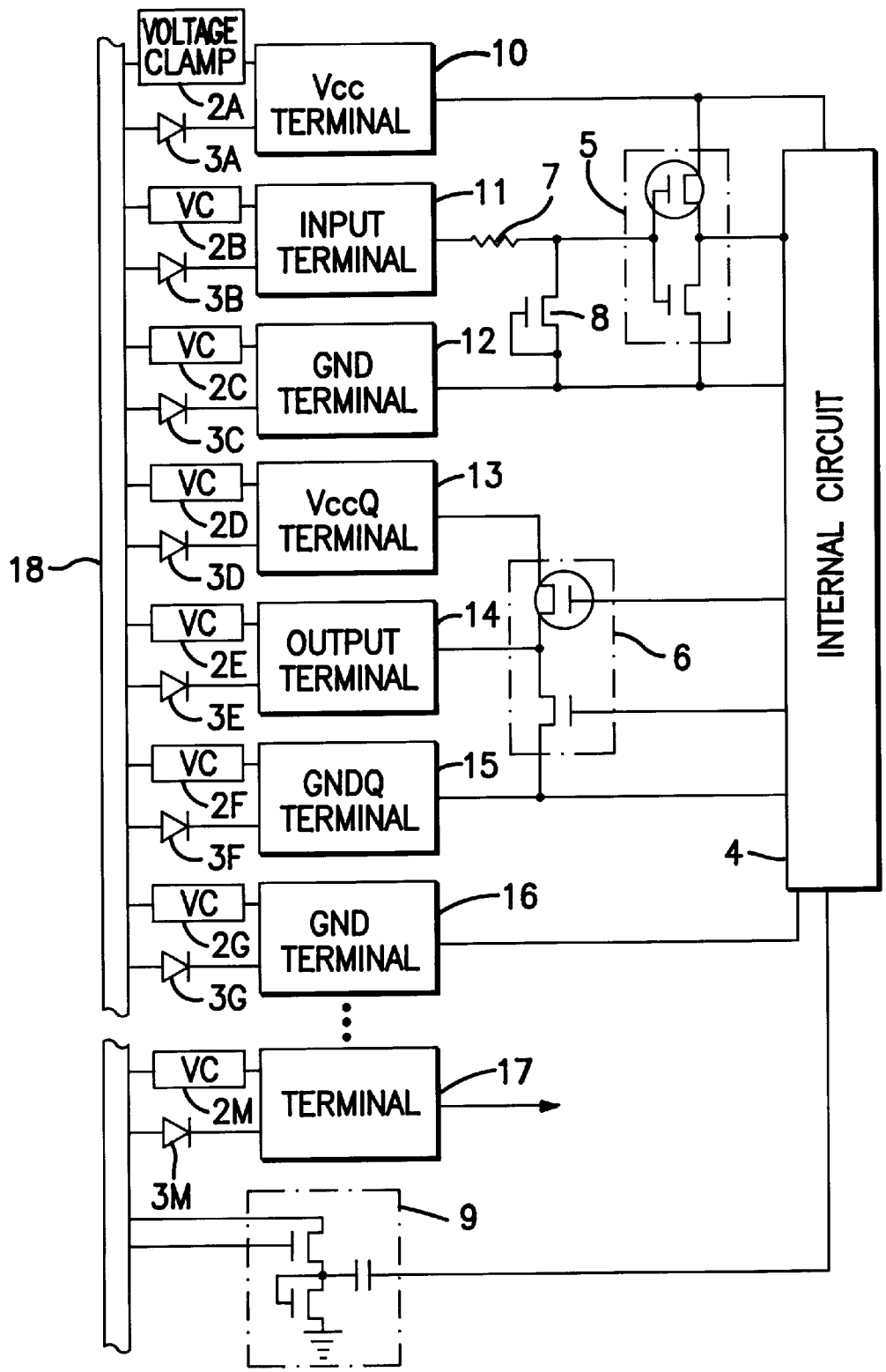
FIG. 1 is a circuit diagram of a semiconductor device showing one example of the prior art.
Figure 2:
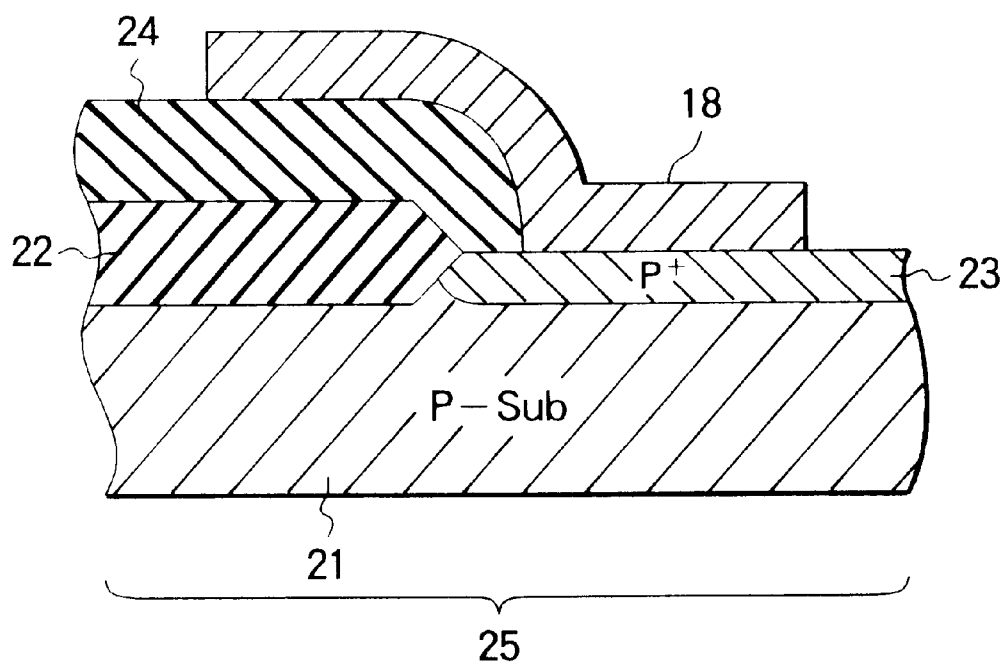
FIG. 2 is a section of a scribe line region on a semiconductor substrate including the circuit of FIG. 1.
Figure 3:
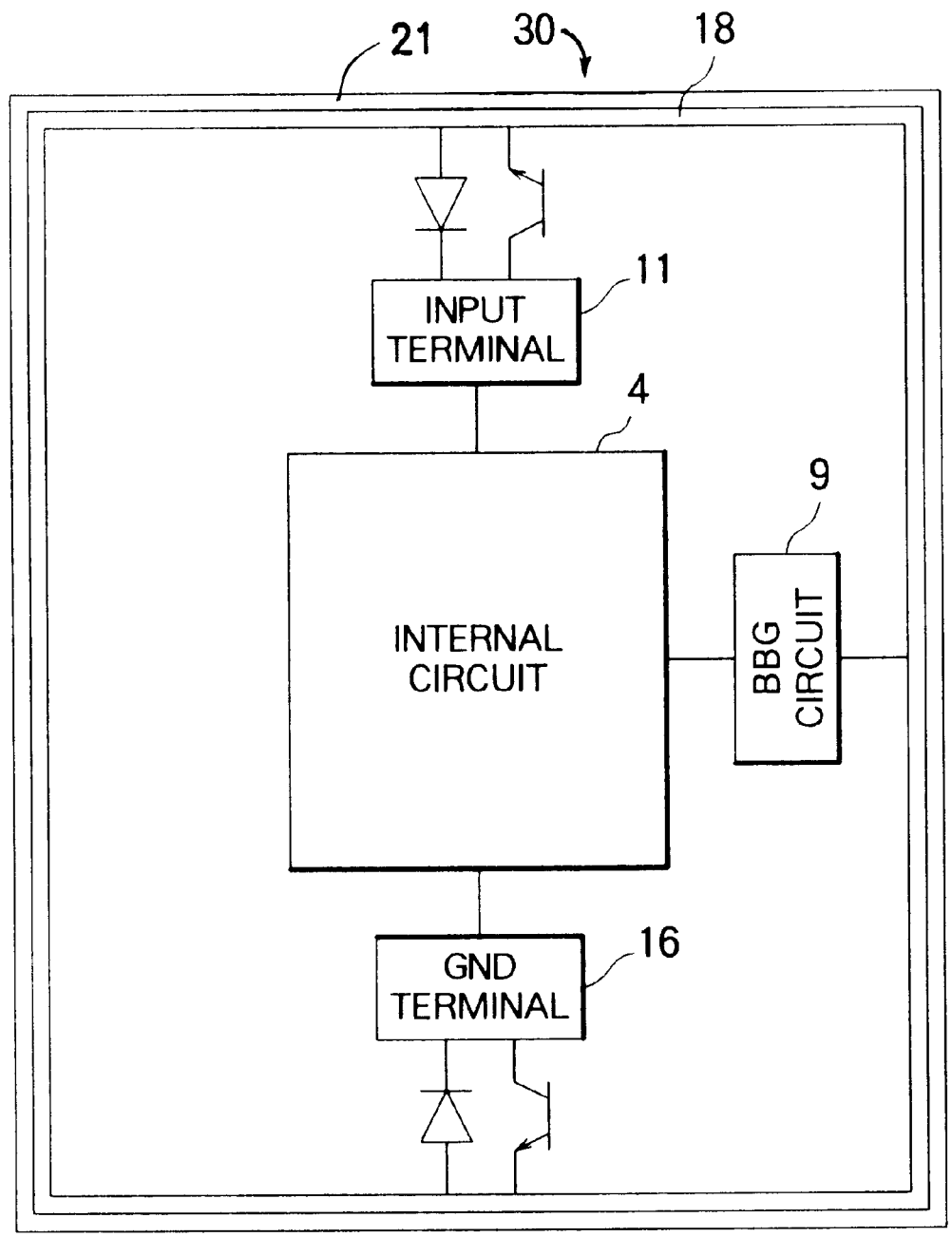
FIG. 3 is a plan view showing a layout of the a chip including the circuit of FIG. 1.
Figure 4:
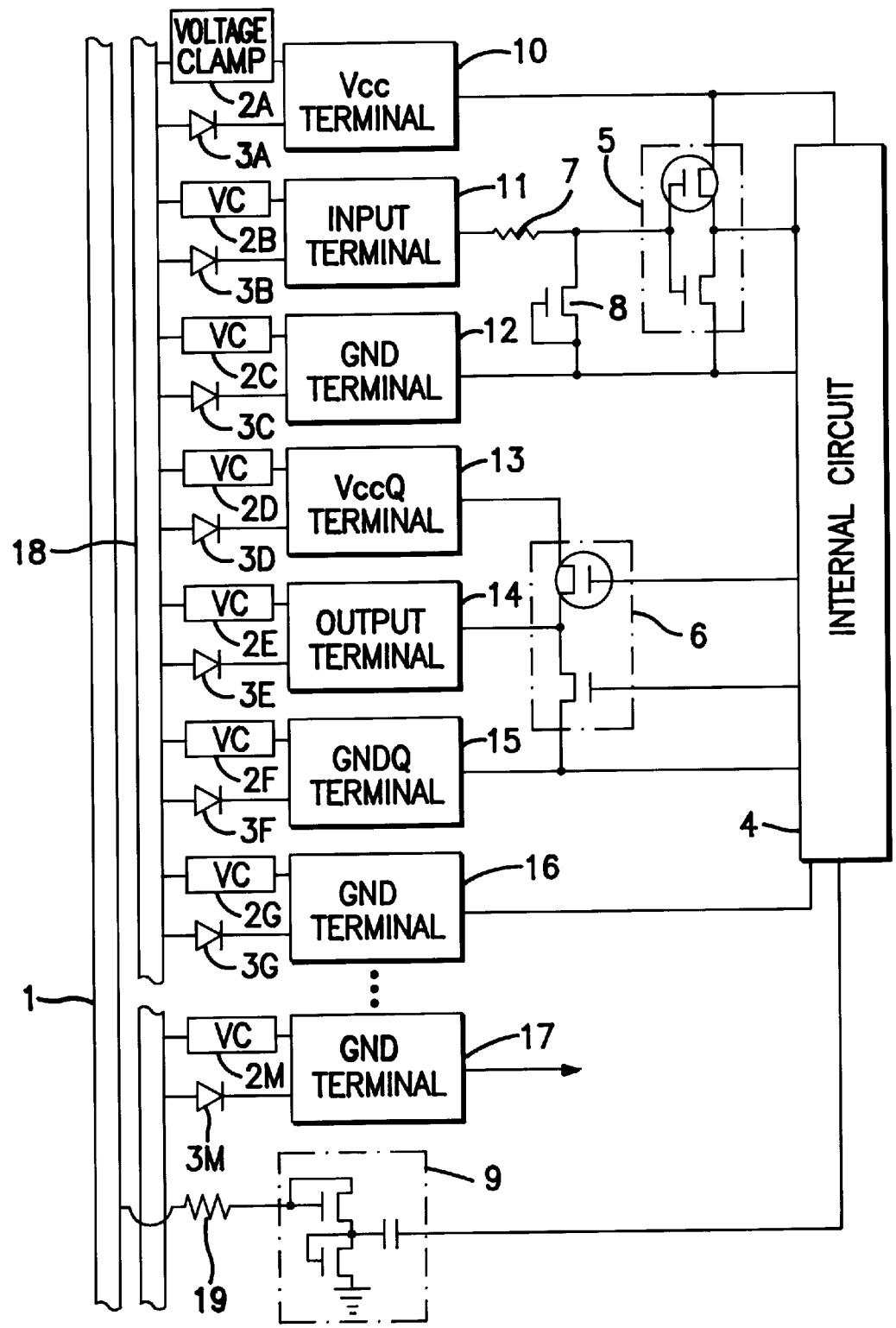
FIG. 4 is a circuit diagram of the preferred embodiment of the semiconductor device according to the present invention.

FIG. 4 is a circuit diagram showing the preferred embodiment of a semiconductor device according to the present invention. In FIG. 4, like elements to those in FIG. 1 will be identified by like reference numerals and detailed description therefor will be neglected to keep the disclosure simple enough to facilitate a clear understanding of the invention. The shown embodiment of the semiconductor device is provided with a plurality of voltage clamping elements 2A to 2M and a plurality of diode elements 3A to 3M connected to respective terminals in parallel as protection elements. A common discharge line 18 constituted of a metal wiring and connects the other ends of the elements for discharging an electrostatic pulse to respective terminals, namely, a power source terminal 10, an input terminal 11, Gnd terminal 12, an output circuit power source (VCCQ) terminal 13, an output terminal 14, an output circuit Gnd terminal 15, an internal circuit Gnd terminal 16, and further terminals exemplified by terminal 17, of the semiconductor integrated circuit constructed with an internal circuit 4, an inverter 5 connected to the internal circuit 4, an output transistor 6, a protection resistor 7 and a BVDS transistor 8. However, in the shown embodiment, the common discharge line 18 is differentiated from the conventional semiconductor device by the floating condition with respect to the substrate.

Also, in the shown embodiment, in addition, a SUB wiring 1 of metal is connected through tunnel wiring 19 to the BBG circuit 9 supplying a bias potential to the semiconductor substrate. Note that the SUB wiring 1 is independent of the common discharge line 18. Furthermore, the common discharge line 18 and the SUB wiring 1 are arranged along the outer sides of the voltage clamping elements 2A to 2M, the diode elements 3A to 3M and a plurality of terminals 10 to 17 at the periphery of the chip. Furthermore, the SUB wiring 1 is formed along the outer periphery of the common discharge line 18 in a parallel loop form.

For example, when the electrostatic pulse is applied to the input terminal 11, if the Gnd terminal 16 is taken as the grounding terminal, the voltage clamping element 2B is turned ON to discharge the electrostatic pulse to the common discharge line 18 and to ground to the Gnd terminal 16 via the diode element 3G. Namely, the electrostatic pulse is not applied to the BBG circuit 9. This is because the output of the BBG circuit 9 is connected only to the SUB wiring 1 via the tunnel wiring 19 formed with a wiring layer other than the common discharge line 18.

Figure 5:
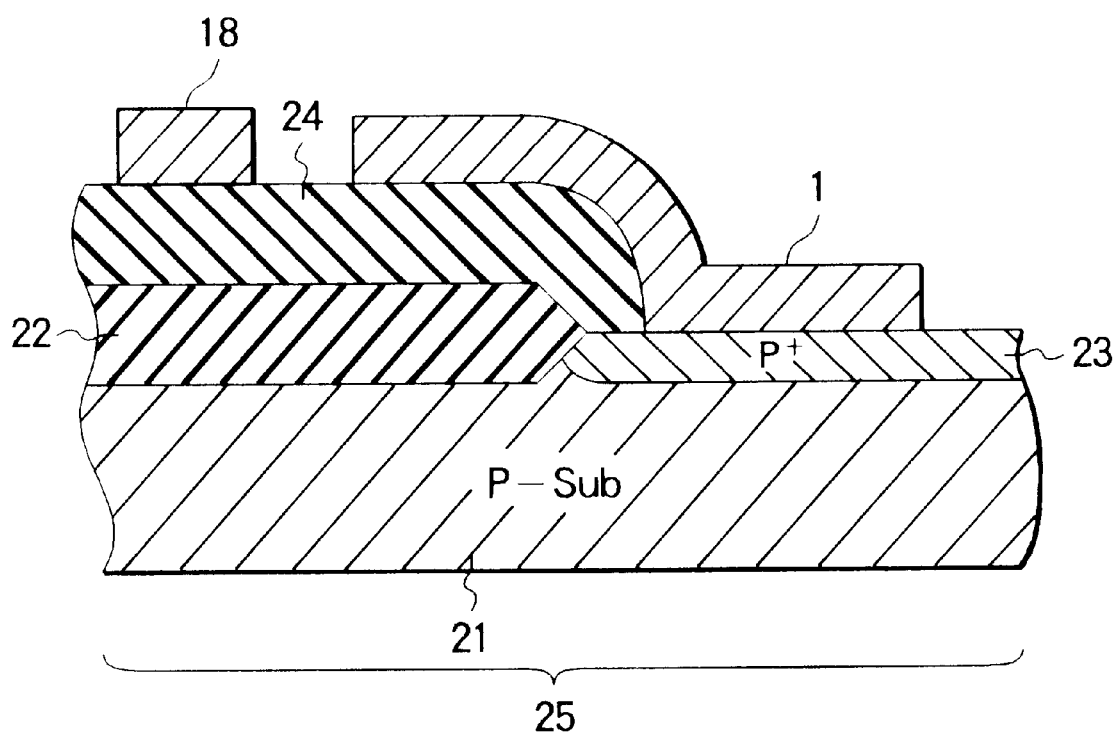
FIG. 5 is a section of the scribe line region on the semiconductor substrate including the circuit of FIG. 4.

FIG. 5 is a section of a scribe line region of the semiconductor substrate including the circuit of FIG. 4. As shown in FIG. 5, in the scribe line region 25 of the semiconductor chip, a P+ diffusion layer 23 is formed on the P-type substrate 21. Through contact of the diffusion layer 23 and the SUB wiring 1 as the metal wiring, the SUB wiring 1 is connected to the semiconductor substrate 21. At this time, below the common discharge line 18, an interlayer insulation layer 24 and the field oxide layer 22 are provided. Therefore, the common discharge line 18 is held in a floating condition relative to the semiconductor substrate. It should be noted that the tunnel wiring 19 connected to the SUB wiring 1 is not shown.

With the construction set forth above, the common discharge wiring 18 and the SUB wiring 1 are completely isolated electrically. The BBG circuit 9 connected to the SUB wiring 1 does not receive the electrostatic pulse. Therefore, electrostatic breakdown will never be caused.

Hereinafter, a detailed discussion will be given with respect to prevention of electrostatic breakdown.

At first, in an ESD test under various standards, when an electrostatic pulse up to ±2000V is applied with Gnd terminal as the discharging terminal, in the preferred embodiment, failure due to electrostatic breakdown can be 0%. Next, concerning increasing chip area, in the prior art, the length of the common discharge line becomes longer at greater chip size to increase the resistance of the wiring to thereby increase the voltage applied to the common discharge line due to the wiring resistance at the peak of the applied electrostatic pulse current. Therefor, the voltage applied to the common discharge line exceeds the withstanding voltage of the PN junction and gate oxide layer of the transistor of the BBG circuit, or of another circuit similarly connected. As a solution in this respect, in order to prevent elevation of the voltage applied to the common discharge line, the width of the wiring is increased in the prior art. However, in the shown embodiment, by separating the common discharge line and the SUB wiring, it becomes unnecessary to increase the width of the wiring. In conjunction therewith, connecting all of the additional circuits, including the BBG circuit to the SUB circuit, thereby not connecting the circuit to be broken down by the electrostatic pulse to the common discharge line; to which high voltage is applied, it is unnecessary to consider wiring resistance as an affect on chip area.

In short, in the present invention, among two parallel metal wiring provided at the outermost circumference (scribe line region of the chip), one is taken as the common discharge line for discharging the electrostatic pulse which is held in floating condition relative to the substrate. The common discharge line is connected to the semiconductor integrated circuit through protective elements. At the outside of the common discharge line and in parallel thereto, the second metal wiring (SUB wiring) is provided. A BBG circuit for introducing negative potential to the semiconductor substrate is connected to the SUB wiring. By this, breakdown of the BBG circuit supplying the negative potential to the semiconductor substrate can be prevented. In conjunction therewith, by separately forming the second metal wiring, the width of the common discharge line can be restricted to avoid increasing chip size.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor device comprising:
    a semiconductor substrate with an integrated circuit thereon and with plural terminals connecting the integrated circuit to a common discharge line in a floating condition relative to the substrate that provides electrostatic breakdown protection for the device, each of said terminals being connected to the common discharge line through a voltage clamping element and a diode element;

a back bias generating circuit on the substrate for supplying a back bias to the substrate; and a further wiring element on the periphery of the substrate that is electrically isolated from the common discharge line and that is connected to the back bias generating circuit and the substrate.

2. The device of claim 1, wherein the common discharge line and the further wiring element are arranged physically parallel to each other on the periphery of a surface of the substrate.

3. The device of claim 2, wherein the further wiring element is radially outside the common discharge line on the surface of the substrate.

4. The device of claim 1, wherein the further wiring element and the common discharge line are radially outside the integrated circuit, the plural terminals, the voltage clamping elements, and the diode elements on a surface of the substrate.

5. The device of claim 4, wherein the common discharge line and the further wiring element are arranged physically parallel to each other around the entire periphery of the surface of the substrate.

6. A semiconductor device comprising:

a semiconductor substrate with an integrated circuit thereon, with a plurality of terminals connected to said integrated circuit, and with a respective voltage clamping circuit and diode provided between said plurality of terminals and a common discharge line;

a sub line provided separately from said common discharge line and connected to said semiconductor substrate; and a back bias circuit generating a back bias voltage and supplying said back bias voltage to said sub line.

* * * * *